US012748132B2

(12) United States Patent
Wang et al.

(10) Patent No.: US 12,748,132 B2
(45) Date of Patent: Sep. 29, 2026

(54) SHUNT RESISTOR, METHOD FOR MANUFACTURING SHUNT RESISTOR, AND CURRENT DETECTION DEVICE

(71) Applicant: Accuenergy (Canada) Inc., Toronto (CA)

(72) Inventors: Yufan Wang, Toronto (CA); Shaohang Cui, Toronto (CA); Ketao Li, Toronto (CA); Liang Wang, Toronto (CA)

(73) Assignee: Accuenergy (Canada) Inc. (CA)

( * ) Notice: Subject to any disclaimer, the term of this patent is extended or adjusted under 35 U.S.C. 154(b) by 169 days.

(21) Appl. No.: 18/780,494

(22) Filed: Jul. 23, 2024

(65) Prior Publication Data

US 2026/0029433 A1 Jan. 29, 2026

(51) Int. Cl.
*G01R 1/20* (2006.01)
*G01R 19/00* (2006.01)
*H01C 17/28* (2006.01)

(52) U.S. Cl.
CPC ......... *G01R 1/203* (2013.01); *G01R 19/0092* (2013.01); *H01C 17/28* (2013.01)

(58) Field of Classification Search
CPC ............................ G01R 1/203; G01R 19/0092
See application file for complete search history.

(56) References Cited

U.S. PATENT DOCUMENTS 5,041,780 A * 8/1991 Rippel ................ G01R 15/207 324/251
9,934,893 B2 4/2018 Murakami et al.
D845,906 S 4/2019 Marten et al.
10,928,424 B2 2/2021 Murakami
11,313,885 B2 * 4/2022 Choi ................. G01R 31/3842
11,387,020 B2 7/2022 Kim
11,422,157 B2 8/2022 Tzivanopoulos et al.
11,488,750 B2 11/2022 Kobayakawa et al.
2017/0212150 A1 7/2017 Kang et al.
2023/0170112 A1 6/2023 Kameko
2023/0343495 A1 * 10/2023 Smith ................ G01R 19/0092
2023/0403800 A1 12/2023 Wang et al.

OTHER PUBLICATIONS

Shunt Series: DC Current Shunt, Revision Date: Dec. 2023 Version: 1.0.2, Accuenergy Inc., https://accucdn.accuenergy.com/wp-content/uploads/shunt-series-dc-current-shunt-datasheet.pdf.
DC current shunt, Accuenergy Inc., https://www.accuenergy.com/products/dc-current-shunt/.

* cited by examiner

*Primary Examiner* — Tung X Nguyen
(74) *Attorney, Agent, or Firm* — Dhiraj Jindal; PATENT YOGI LLC

(57) ABSTRACT

A shunt resistor for current measurement comprises a resistance element and a pair of electrodes connected to its ends, featuring recessed side surfaces and L-shaped openings for temperature drift mitigation. Voltage detection portions integrated into the electrodes ensure precise alignment and reduced thermal stress. Threaded bolts serve as input and output current connection points. A method for manufacturing the shunt resistor involves forming recessed portions, incorporating L-shaped openings, and integrating voltage detection portions. A current detection device includes the shunt resistor, a DIN rail-affixed base, bus bar openings, and a cable to transfer voltage to a power meter.

8 Claims, 19 Drawing Sheets

SHUNT RESISTOR, METHOD FOR MANUFACTURING SHUNT RESISTOR, AND CURRENT DETECTION DEVICE

FIELD OF THE INVENTION

The present disclosure relates to a shunt resistor, a method for manufacturing the shunt resistor and a current detection device including the shunt resistor.

BACKGROUND

Shunt resistors are widely used in electrical systems to measure current by detecting the voltage drop across the resistor. The accuracy and stability of these measurements are critical in many applications, including power meters, battery management systems, and industrial automation.

Traditional shunt resistors often suffer from issues such as temperature drift and resistance variability, which can lead to inaccurate current measurements.

SUMMARY OF THE INVENTION

The present invention provides a highly accurate and stable shunt resistor for current measurement, as well as a current detection device incorporating the shunt resistor. The shunt resistor is designed to minimize temperature drift and enhance measurement precision, making it suitable for various applications that require reliable current measurement.

The shunt resistor comprises a resistance element and a pair of electrodes connected to opposite ends of the resistance element in a first direction. Each electrode has a contact surface interfacing with the resistance element and is equipped with bolt holes for secure attachment. Recessed portions are formed on opposite side surfaces of the shunt resistor, extending in a second direction perpendicular to the first direction. These recessed portions help to reduce stress concentration and thermal expansion differences, thereby ensuring stable performance under varying temperature conditions.

Each electrode incorporates an L-shaped opening, with the first linear portion parallel to the first direction and the second linear portion parallel to the second direction. For optimal temperature drift mitigation, the lengths of these linear portions are equal. The shunt resistor also includes voltage detection portions integrated into the electrodes. These voltage detection portions are hollow cylindrical projections that extend vertically from the surface of the electrodes and are coaxially aligned with through holes in the electrodes. They are welded to the electrodes to provide secure and precise alignment, which reduces thermal expansion-induced stress.

Threaded bolts are positioned between the L-shaped openings and the end surfaces of the electrodes, serving as connection points for input and output current signals. These bolts are riveted to the electrodes to ensure low-resistance electrical connections and mechanical stability.

The invention also includes a method for manufacturing the shunt resistor, involving the preparation of a long shunt resistor base material with the pair of electrodes connected to the ends of the resistance element in a first direction. Recessed portions are formed on opposite side surfaces of the shunt resistor, extending in a second direction. L-shaped openings are incorporated into each electrode, with equal lengths for the first and second linear portions. Voltage detection portions are integrated and welded into the electrodes, and threaded bolts are positioned and riveted to the electrodes.

Furthermore, the present invention provides a current detection device that incorporates the shunt resistor. The device includes a base component configured to be affixed to a DIN rail and a cover component installed onto the base component using a snap-fit mechanism. The device has openings on the left top and left bottom to allow bus bars carrying input and output current signals to enter and exit the device, respectively. A cable connected to the voltage detection portions of the shunt resistor transfers the measured voltage to a power meter. The device also features an opening in the middle for displaying a label with shunt resistor information, and a screw securing the cover component to the base component through a hollow cylindrical projection.

The current detection device may also include a clip for affixing the base component to the DIN rail, bus bars fixed to threaded bolts of the shunt resistor using metal grommets and nuts, and a support component to accommodate and protect the cable. The base component may feature isolated grid spaces to improve the heat dissipation efficiency of the shunt resistor installed in the device.

This comprehensive design ensures that the shunt resistor and current detection device provide highly accurate and reliable current measurements with minimal temperature drift, making them suitable for a wide range of applications.

DETAILED DESCRIPTION

Figure 1:
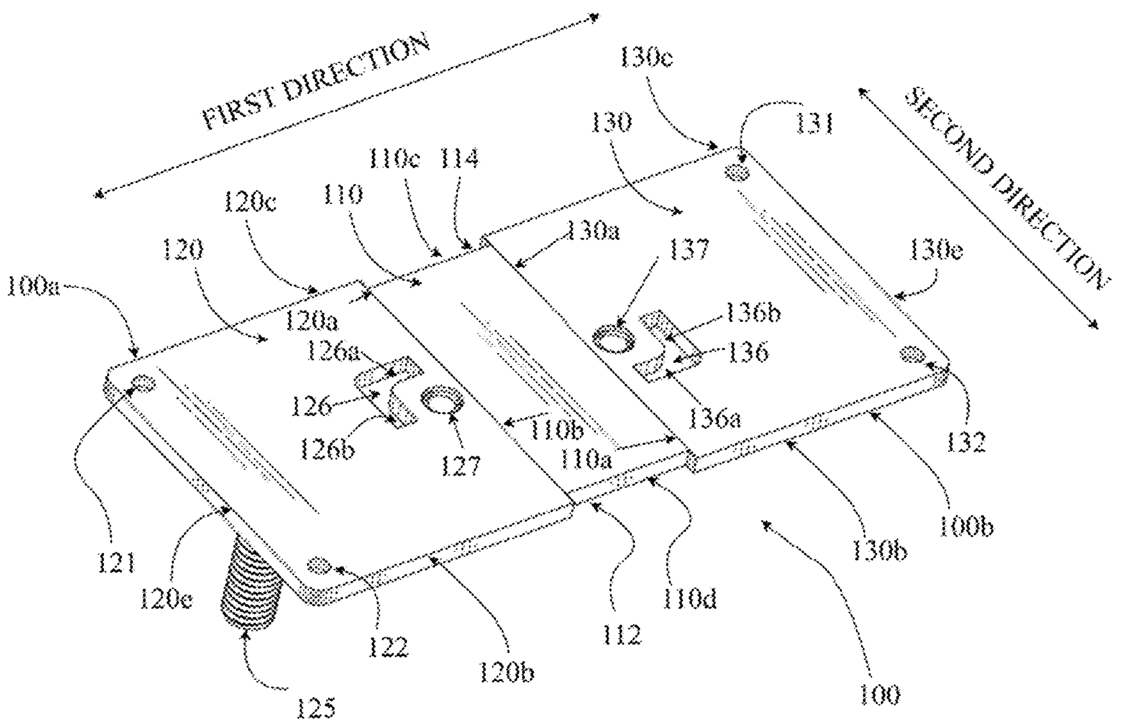
FIG. 1 is a rear perspective view of a shunt resistor according to some embodiments of the present invention.

The following description should be read with reference to the drawings, in which like elements in different drawings are numbered in like fashion. The drawings, which are not necessarily to scale, depict selected embodiments and are not intended to limit the scope of the invention. Although examples of construction, dimension, and materials are illustrated for the various elements, those skilled in the art will recognize that many of the examples provided have suitable alternatives that may be utilized.

Herein the terms "up," "down." "right." and "left" are relative terms used to describe the orientation or direction of components, primarily for the ease of understanding the invention. They serve as spatial references to facilitate the description and are generally defined in relation to the figures presented in the drawings. It's essential to note that these terms are not intended to limit the invention to any specific orientation or spatial configuration unless explicitly stated.

In most cases, the use of these terms is standardized to match the orientation as presented in the drawings accompanying the patent application. However, the terms are relative to the "viewer" or the point of view in the drawings, and not necessarily indicative of a fixed spatial orientation in real-world use of the invention.

Figure 2:
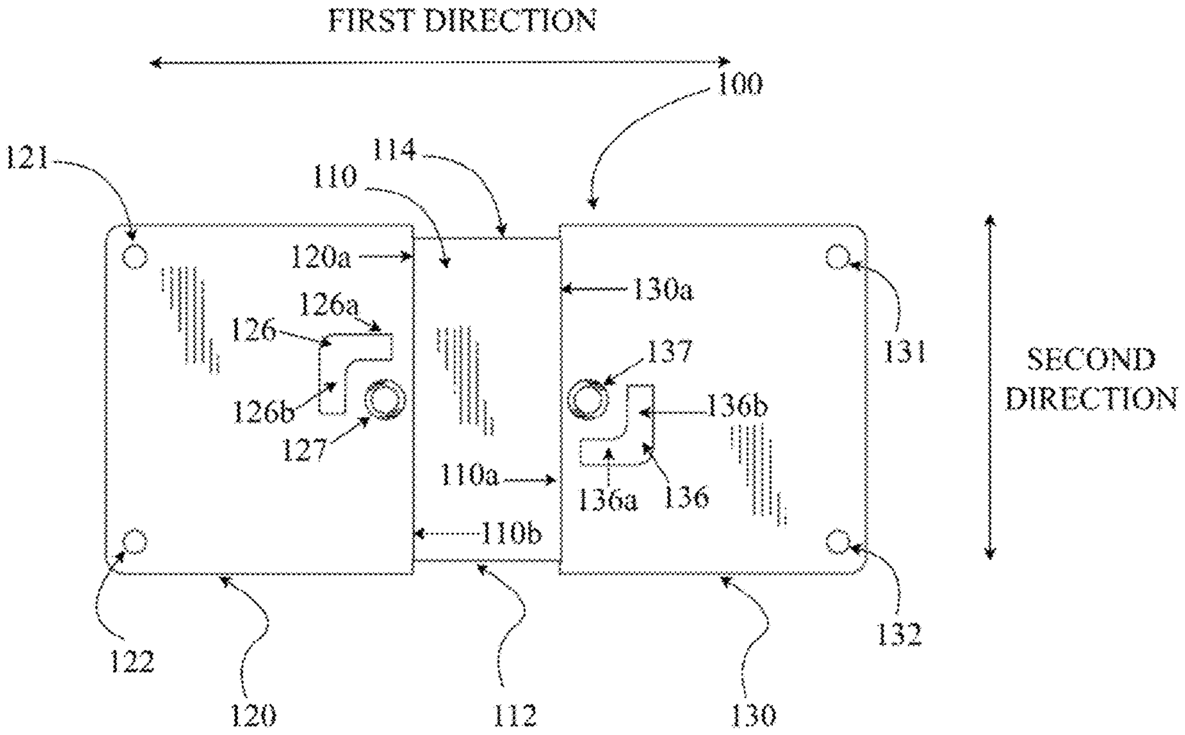
FIG. 2 is a rear view of a shunt resistor according to some embodiments of the present invention.
Figure 3:
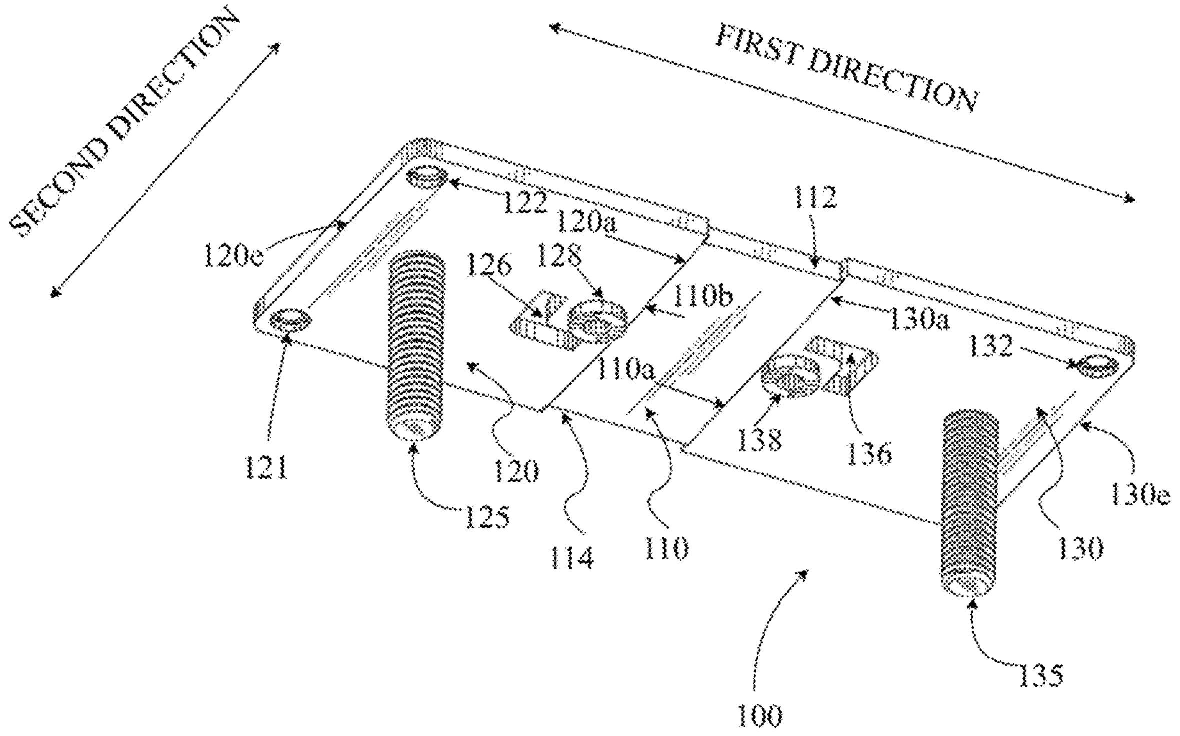
FIG. 3 is a front perspective view of a shunt resistor according to some embodiments of the present invention.
Figure 4:
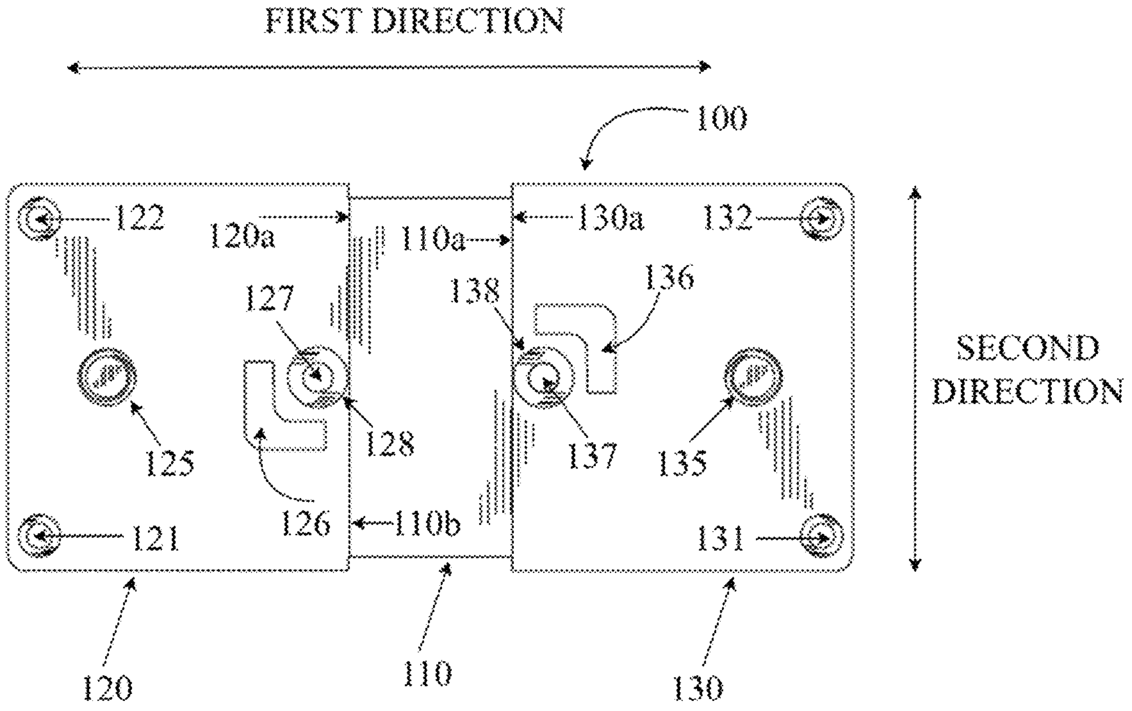
FIG. 4 is a front view of a shunt resistor according to some embodiments of the present invention.
Figure 5:
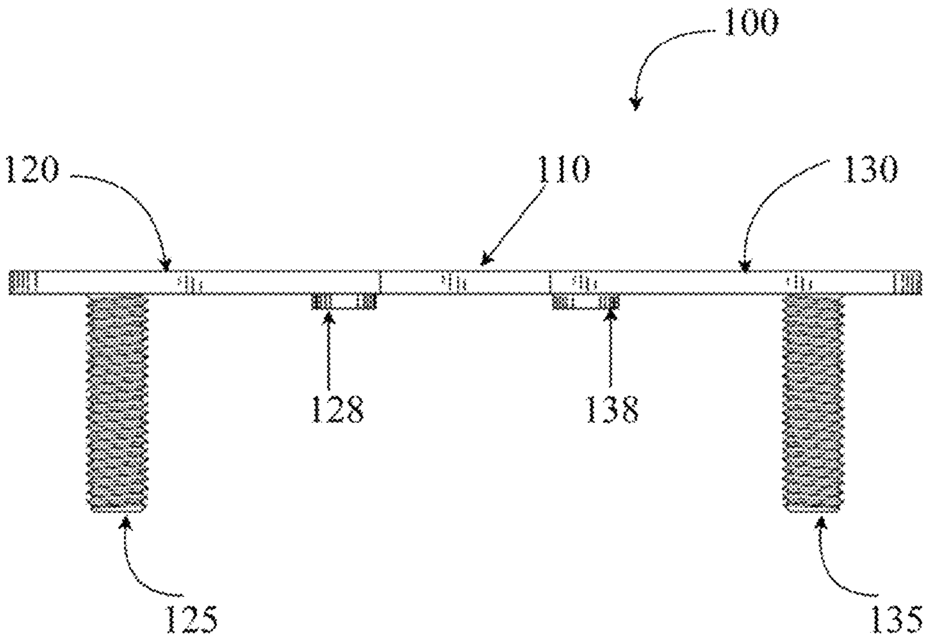
FIG. 5 is a top view of a shunt resistor according to some embodiments of the present invention.
Figure 6:
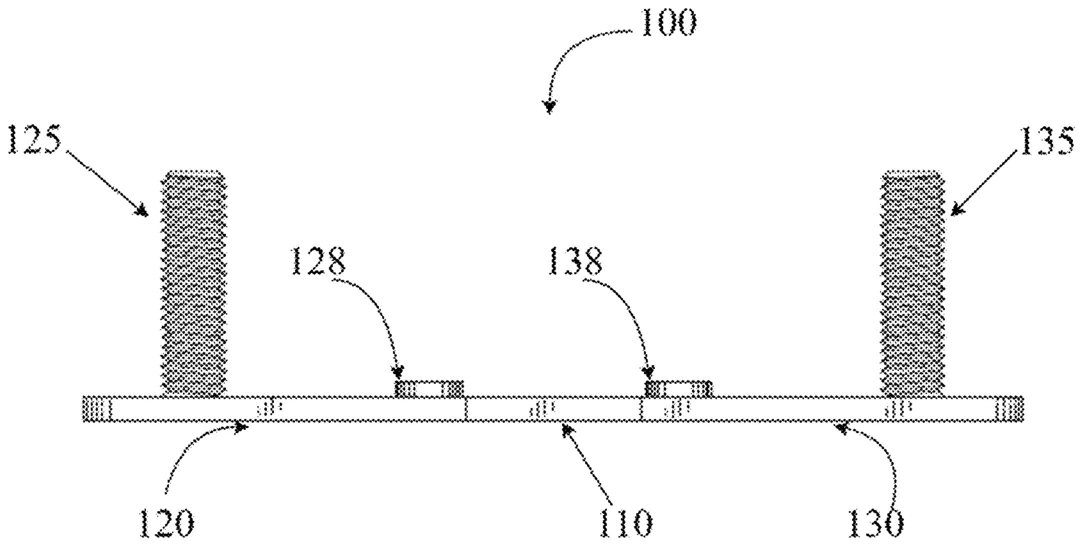
FIG. 6 is a bottom view of a shunt resistor according to some embodiments of the present invention.
Figure 7:
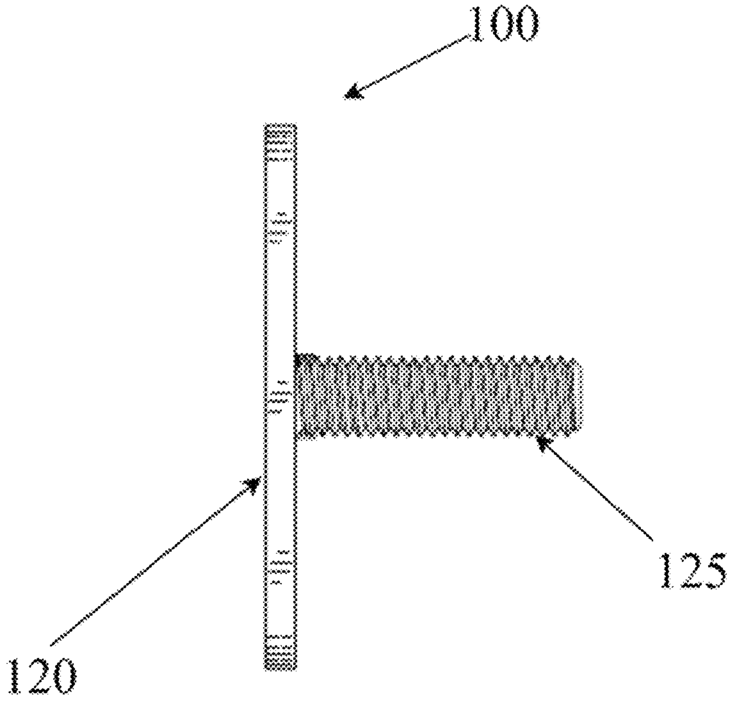
FIG. 7 is a left side view of a shunt resistor according to some embodiments of the present invention.
Figure 8:
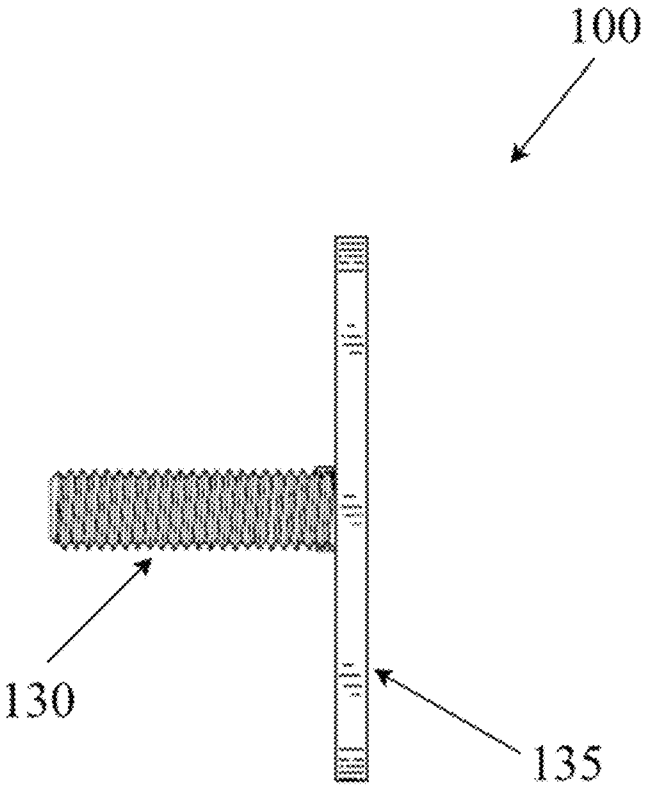
FIG. 8 is a right side view of a shunt resistor according to some embodiments of the present invention.

FIG. 1 is a rear perspective view showing one embodiment of a shunt resistor 100, and FIG. 2 is a plan rear view of the shunt resistor 100 shown in FIG. 1. FIG. 3 is a front perspective view showing one embodiment of the shunt resistor 100, and FIG. 4 is a plan front view of the shunt resistor 100 shown in FIG. 3. FIG. 5 is a top view of the shunt resistor 100, and FIG. 6 is a bottom view of the shunt resistor 100. FIG. 7 is a left side view of the shunt resistor 100, and FIG. 8 is a right-side view of the shunt resistor 100.

As illustrated in FIGS. 1-8, the shunt resistor 100 comprises a resistance element 110, which is fabricated from a resistor alloy plate material of predetermined thickness and width. This element is accompanied by a pair of electrodes, 120 and 130, constructed from a highly conductive metal, each electrode being affixed to opposite ends (i.e., connecting surfaces) **110*a* and 110*b* of the resistance element 110 in a first direction. Electrode 120 features a contact surface 120*a* that interfaces with one end (110*b*) of the resistance element 110, while electrode 130 includes a contact surface 130*a* that interfaces with the other end (110*a*) of the resistance element 110. Additionally, the electrodes 120 and 130 are equipped with bolt holes 121, 122, 131, and 132, respectively, facilitating the attachment of the shunt resistor 100** via screws or similar fastening mechanisms.

The first direction refers to the length direction of the resistance element 110, corresponding to the overall length direction of the shunt resistor 100. This length direction is defined by the sequential arrangement of electrode 120, resistance element 110, and electrode 130. Perpendicular to this first direction is the second direction, which corresponds to the width direction of the shunt resistor 100. As depicted in FIGS. 1-8, the electrodes 120 and 130 are identical in structure and are symmetrically positioned relative to the resistance element 110.

The connecting surfaces **110*a* and 110*b* of the resistance element 110 are bonded to the electrodes 120 and 130 through welding techniques, such as electron beam welding, laser beam welding, or brazing. The resistance element 110 is typically constructed from a low-resistance alloy material, for example, a Cu—Mn alloy. The electrodes 120 and 130** are preferably made of copper (Cu) to ensure high conductivity and minimal contact resistance.

As depicted in FIGS. 1-8, the shunt resistor 100 features recessed portions 114 and 112 on opposite side surfaces **100*a* and 100*b*, respectively. The recessed portion 114 is formed on side surface 100*a* and extends inward towards the center of the shunt resistor 100, while the recessed portion 112 is formed on side surface 100*b* and also extends inward towards the center of the shunt resistor 100. Both recessed portions 114 and 112 extend in the same direction, identified as the second direction. When viewed from above, perpendicular to both the first and second directions, the recessed portions 114 and 112** exhibit a rectangular shape.

Side surface **100*a* of the shunt resistor 100 is parallel to the first direction and comprises side surfaces 120*c* and 130*c* of electrodes 120 and 130, respectively. Similarly, side surface 100*b*, which is opposite side surface 100*a*, is also parallel to the first direction and comprises side surfaces 120*b* and 130*b* of electrodes 120 and 130, respectively. The side surface 120*c* of electrode 120 is aligned on an extension line with the side surface 130*c* of electrode 130, and side surface 120*b* of electrode 120 is aligned on an extension line with the side surface 130*b* of electrode 130. Side surfaces 120*b* and 130*b* are parallel to side surfaces 120*c* and 130*c***.

The recessed portion 112 features a side surface **110*d* of the resistance element 110, which is parallel to the first direction. Similarly, recessed portion 114 features a side surface 110*c* of the resistance element 110, also parallel to the first direction. The recessed portion 112 is bounded by side surfaces 110*d*, 110*a*, and 110*b*, while recessed portion 114 is bounded by side surfaces 110*c*, 110*a*, and 110*b***.

The recessed portions 112 and 114 reduce stress concentration and thermal expansion differences, ensuring stable performance under varying temperature conditions. The materials and precise alignment of the electrodes and resistance element are selected to enhance conductivity and minimize resistance variability, thereby improving the overall accuracy of current measurement.

As shown in FIGS. 1-8, electrode 120, located near the resistance element 110, incorporates an L-shaped opening 126. This L-shaped opening consists of a first linear portion **126*a*, which runs parallel to the first direction, and a second linear portion 126*b*, which runs parallel to the second direction. To achieve optimal temperature drift mitigation, the length of the first linear portion 126*a*, measured along the first direction, is equal to the length of the second linear portion 126*b*, measured along the second direction. The primary purpose of this L-shaped opening 126 is to mitigate temperature drift within the shunt resistor 100**.

Similarly, electrode 130, also positioned adjacent to the resistance element 110, includes an L-shaped opening 136.

This opening comprises a first linear portion 136*a* parallel to the first direction and a second linear portion 136*b* parallel to the second direction. To achieve optimal temperature drift mitigation, the length of the first linear portion 136*a*, measured along the first direction, is equal to the length of the second linear portion 136*b*, measured along the second direction. The L-shaped opening 136 serves the same function of reducing temperature drift in the shunt resistor 100.

As illustrated in FIGS. 1-8, electrode 130 includes a through hole 137 positioned between the L-shaped opening 136 and the contact surface 110*a*. Similarly, electrode 120 features a through hole 127 located between the L-shaped opening 126 and the contact surface 110*b*.

Referring to FIGS. 3-6, electrode 130 is equipped with a voltage detection portion 138 situated between the L-shaped opening 136 and the contact surface 110*a*. As shown in FIG. 4, the outermost surface of the voltage detection portion 138 makes contact with the contact surface 110*a* of the resistance element 110. The voltage detection portion 138 is designed as a hollow cylindrical projection extending vertically from the surface of electrode 130, directly above the through hole 137. The through hole 137 and the voltage detection portion 138 are coaxially aligned, with the diameter of through hole 137 matching the inner diameter of the voltage detection portion 138. This voltage detection portion 138 is welded to electrode 130, ensuring a secure and precise alignment.

The combination of the voltage detection portion 138 and the through hole 137 provides several advantages. The coaxial alignment of the through hole 137 with the voltage detection portion 138 ensures that the voltage detection is highly accurate and consistent, minimizing measurement errors. This precise alignment also contributes to the reduction of thermal expansion-induced stress, which in turn mitigates temperature drift. By maintaining a stable electrical connection and reducing the impact of temperature variations on the measurement, this design enhances the overall accuracy and reliability of the shunt resistor 100. Additionally, the hollow cylindrical shape of the voltage detection portion 138 allows for a robust mechanical connection, further ensuring long-term stability and performance.

Similarly, electrode 120 includes a voltage detection portion 128, also positioned between the L-shaped opening 126 and the contact surface 110*b*. This voltage detection portion 128, like its counterpart, is a hollow cylindrical projection extending vertically from the surface of electrode 120 and is coaxially aligned with through hole 127. The diameter of through hole 127 matches the inner diameter of the voltage detection portion 128, which is welded to electrode 120 for a secure and accurate attachment.

The voltage generated at both ends of the resistance element 110 is measured by connecting conductive wires, such as aluminum wires, through ring-type lugs to the voltage detection portions 128 and 138. This configuration enables simple and effective voltage measurement of the resistance element 110.

Additionally, as shown in FIGS. 1-8, electrode 120 features a threaded bolt 125 positioned between the L-shaped opening 126 and the end surface 120*e*. The end surface 120*e* is opposite and parallel to the contact surface 120*a*. Threaded bolt 125 serves as the connection point for the input current signal. The current to be measured by the shunt resistor 100 enters through the threaded bolt 125, which is securely riveted to electrode 120. It then passes through the resistance element 110 and exits the shunt resistor 100 via the threaded bolt 135, which is also riveted to electrode 130.

The threaded bolt 125 offers a robust and secure connection point for the input current signal. The threading ensures that the connection remains tight and stable, reducing the risk of loosening or disconnection that could lead to inaccurate measurements or signal loss. Riveting the threaded bolt 125 to electrode 120 ensures a low-resistance electrical connection. This minimizes contact resistance and potential voltage drops at the connection point, which is crucial for maintaining high accuracy in current measurement.

The secure attachment of the threaded bolt 125 to electrode 120 provides mechanical stability. This stability helps maintain the integrity of the electrical connection even under varying environmental conditions, such as vibrations or thermal expansion and contraction. The threaded design allows for easy installation and removal of the current-carrying conductor. This can be particularly advantageous in field applications where quick and reliable connections are necessary.

The placement of the threaded bolt 125 between the L-shaped opening 126 and the end surface 120*c* helps distribute thermal expansion evenly. This reduces thermal stress on the electrode and the resistance element, thereby mitigating temperature drift and ensuring consistent measurement accuracy. The threaded bolt 125 can accommodate various types of connectors and wiring configurations, making the shunt resistor 100 versatile for different applications and setups.

Similarly, electrode 130 is equipped with a threaded bolt 135 located between the L-shaped opening 136 and the end surface 130*e*. The end surface 130*e* is opposite and parallel to the contact surface 130*a*. Threaded bolt 135 functions as the connection point for the output current signal, with the current signal flowing out of the shunt resistor 100 through this bolt.

These design elements, including the L-shaped openings, voltage detection portions, and threaded bolts, collectively enhance the performance of the shunt resistor 100. They ensure low temperature drift and high accuracy, providing reliable and precise current measurement.

The present invention also presents a method for manufacturing a shunt resistor designed to achieve low temperature drift and high accuracy, making it suitable for precise current measurement applications.

The process begins with the preparation of the base material. A long shunt resistor base material is obtained, which includes a resistance element made from a low-resistance alloy material such as Cu—Mn alloy. A pair of electrodes are then affixed to opposite ends of the resistance element in the length direction, using highly conductive metal, preferably copper.

Next, recessed portions are formed on the opposite side surfaces of the shunt resistor base material. These recessed portions should extend inward towards the center of the shunt resistor in the width direction, which is perpendicular to the length direction. It is important to ensure that these recessed portions have a rectangular shape when viewed from above, as this helps to reduce stress concentration and thermal expansion differences, ensuring stable performance under varying temperature conditions.

Following this, L-shaped openings are incorporated into each electrode near the resistance element. These openings consist of a first linear portion parallel to the length direction and a second linear portion parallel to the width direction. Ensuring that the lengths of the first and second linear portions are equal is crucial, as this configuration mitigates temperature drift by allowing controlled expansion and contraction of the electrodes.

Subsequently, voltage detection portions are integrated into the electrodes. These portions are designed as hollow cylindrical projections that extend vertically from the surface of the electrodes. Through holes are drilled in the electrodes at positions where the voltage detection portions are to be integrated, ensuring that these through holes are coaxially aligned with the hollow cylindrical projections. The voltage detection portions are then welded to the electrodes directly above the through holes, securing precise alignment that is crucial for accurate voltage measurement and minimizing thermal expansion-induced stress.

Threaded bolts are then positioned between the L-shaped openings and the end surfaces of the electrodes, which should be opposite and parallel to the contact surfaces where the electrodes interface with the resistance element. These threaded bolts serve as connection points for the input and output current signals. The input current signal enters through a threaded bolt on one electrode, passes through the resistance element, and exits through a threaded bolt on the opposite electrode. The threaded bolts are riveted to the electrodes to ensure a low-resistance electrical connection and mechanical stability under varying environmental conditions, such as vibrations or thermal expansion and contraction.

To ensure accuracy and reliability, it is essential to use high-quality materials for the resistance element alloy and electrode metal to minimize resistance variability. Precise welding techniques, such as electron beam welding, laser beam welding, or brazing, should be employed to bond the connecting surfaces of the resistance element to the electrodes. Finally, the assembled shunt resistor should be tested for electrical and thermal performance to verify low temperature drift and high accuracy.

Figure 9:
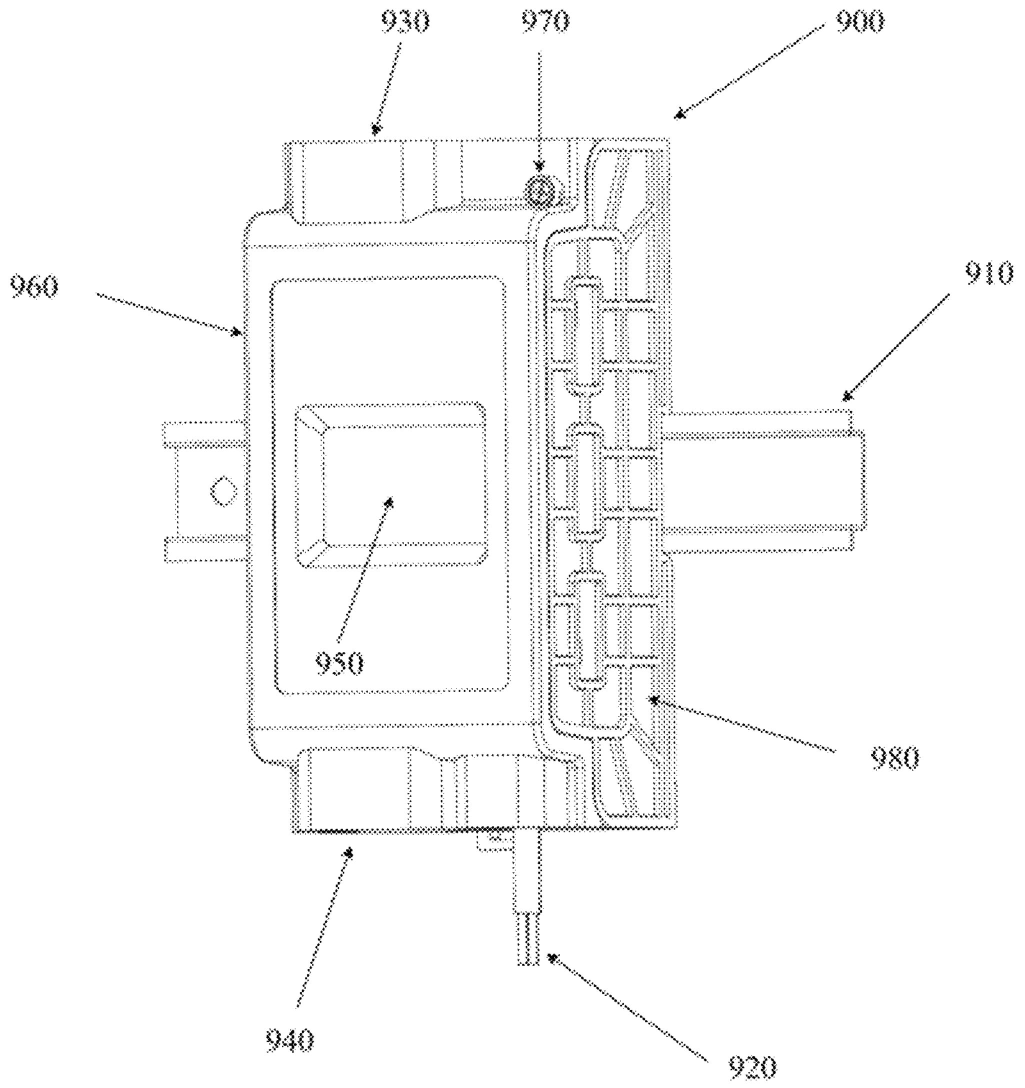
FIG. 9 is a front perspective view of a current detection device according to some embodiments of the present invention.

FIG. 9 is a front perspective view of a current detection device 900. In FIG. 9, the current detection device 900 is mounted on a DIN rail 910. The current detection device 900 comprises a cover component 960 and a base component 980. In some embodiments, the cover component 960 is installed onto the base component 980 using a snap-fit mechanism. An opening 930 on the left top of the current detection device 900 allows a bus bar carrying the input current signal to enter the device. Another opening 940 on the left bottom allows a bus bar carrying the output current signal to exit the device. A screw 970 on the right top of the current detection device 900 secures the cover component 960 to the base component 980. A cable 920, located at the right bottom of the current detection device 900, is connected to the voltage detection portions of the shunt resistor 100. This cable 920 may be connected to a power meter installed on the DIN rail 910 to transfer the measured voltage to the power meter. An opening 950 in the middle of the current detection device 900 displays a label containing shunt resistor information such as rated current, accuracy, voltage drop, manufacturer, etc.

Figure 10:
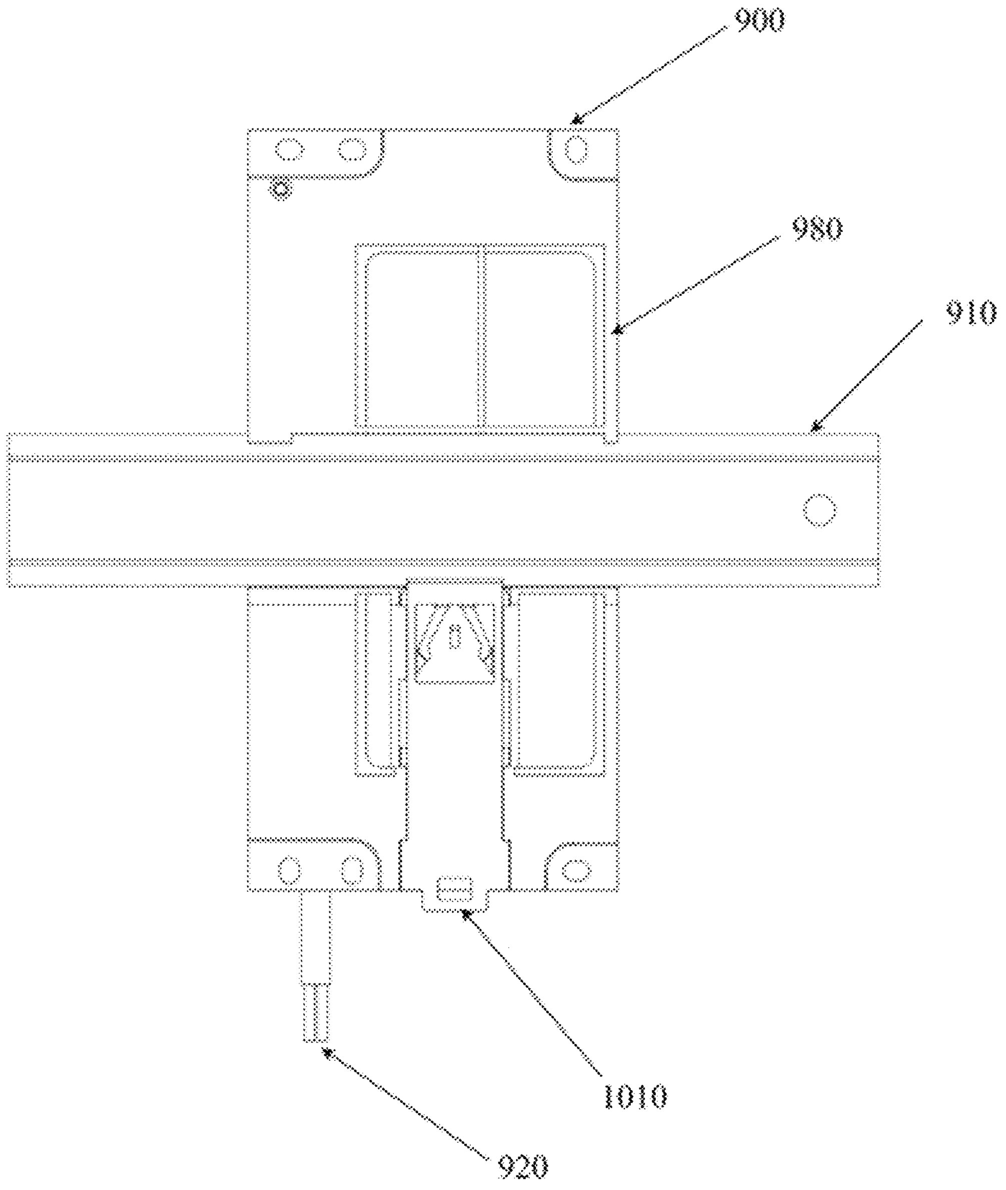
FIG. 10 is a rear view of a current detection device according to some embodiments of the present invention.

FIG. 10 is a rear perspective view of the current detection device 900. In FIG. 10, the current detection device 900 is affixed to the DIN rail 910 via a clip 1010.

Figure 11:
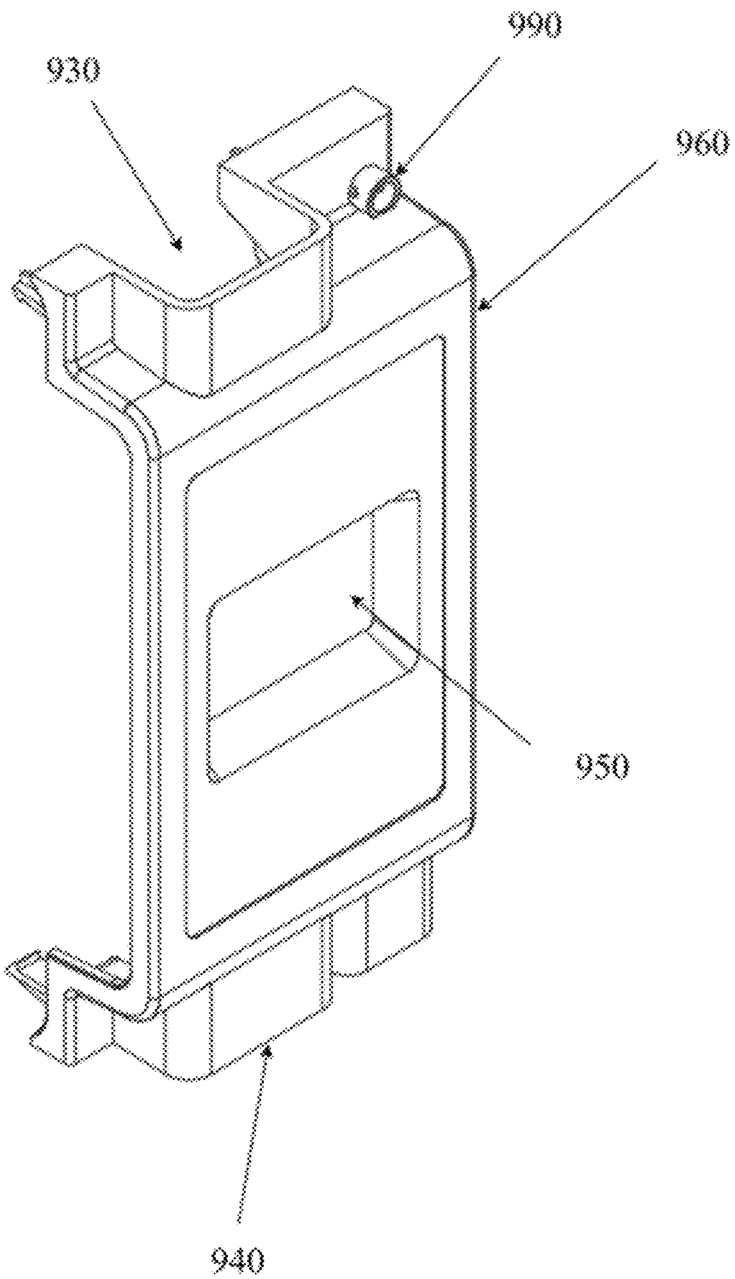
FIG. 11 is a front perspective view of a cover component of a current detection device according to some embodiments of the present invention.
Figure 12:
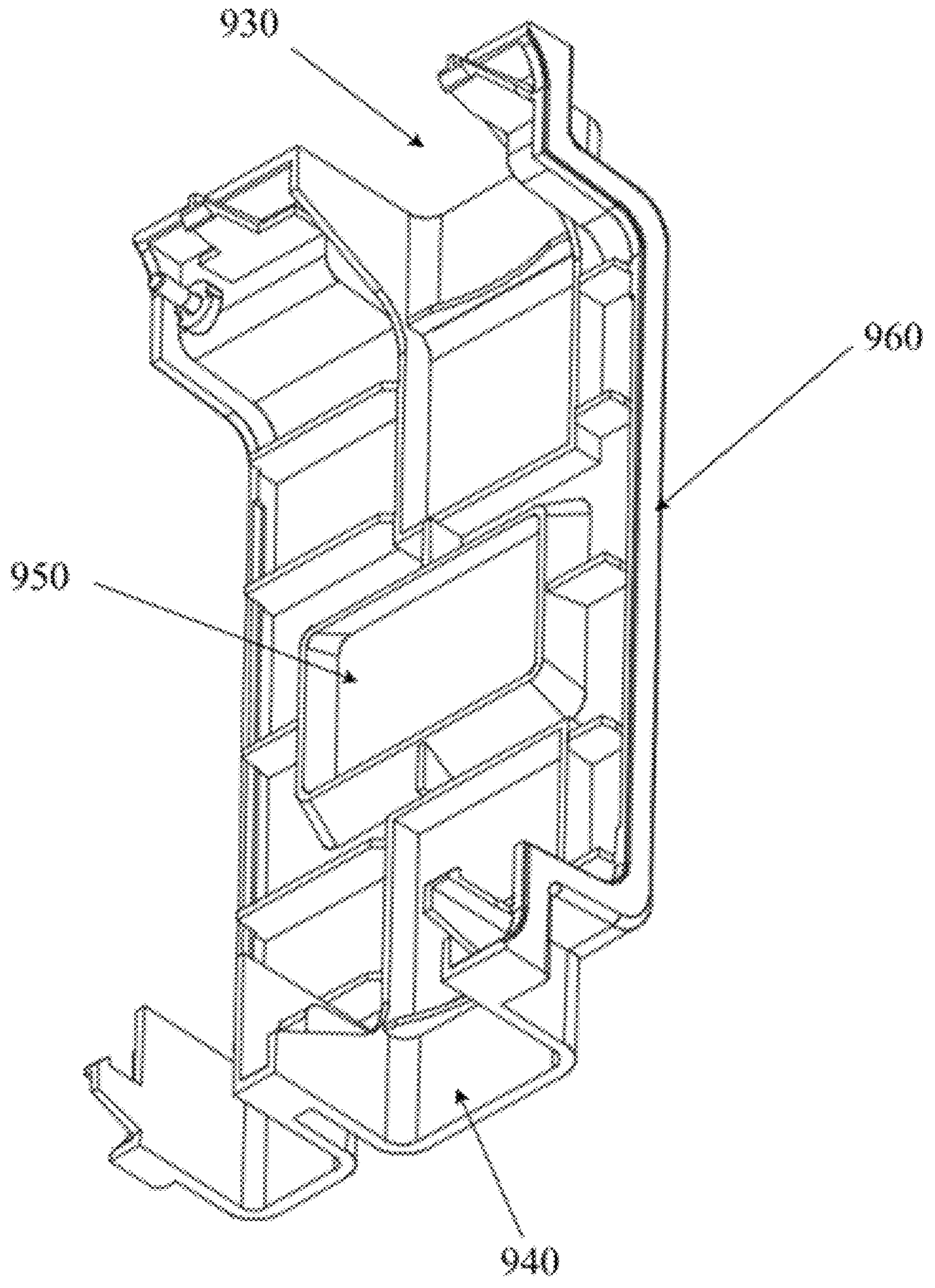
FIG. 12 is a rear perspective view of a cover component of a current detection device according to some embodiments of the present invention.

FIG. 11 is a front perspective view of the cover component 960 of the current detection device 900, and FIG. 12 is a rear perspective view of the cover component 960. A hollow cylindrical projection 990 on the top right of the cover component 960, as shown in FIG. 11, accommodates the screw 970, which fixes the cover component 960 to the base component 980 through the hollow cylindrical projection 990.

Figure 13:
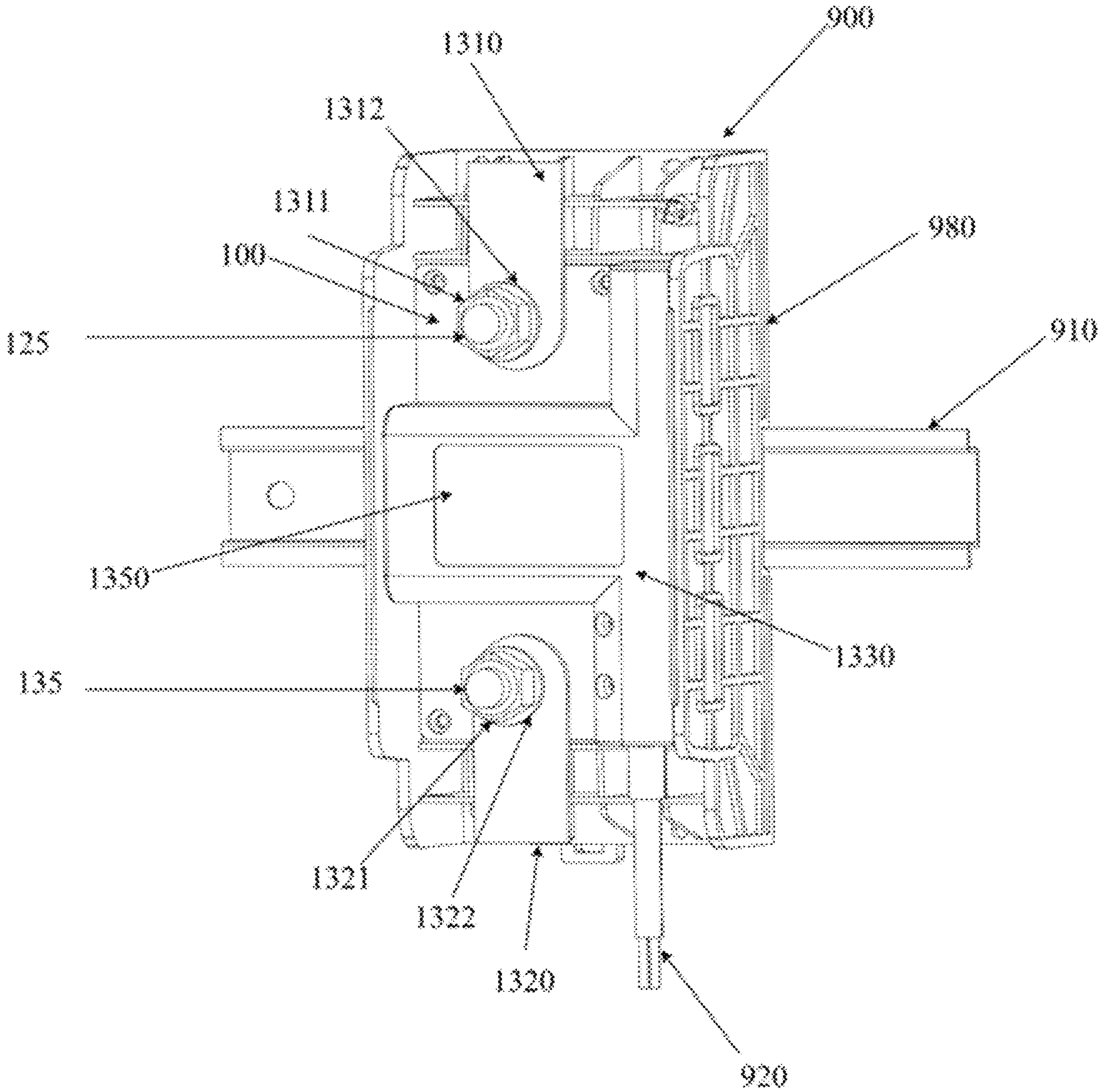
FIG. 13 is a current detection device with a cover component removed according to some embodiments of the present invention.
Figure 14:
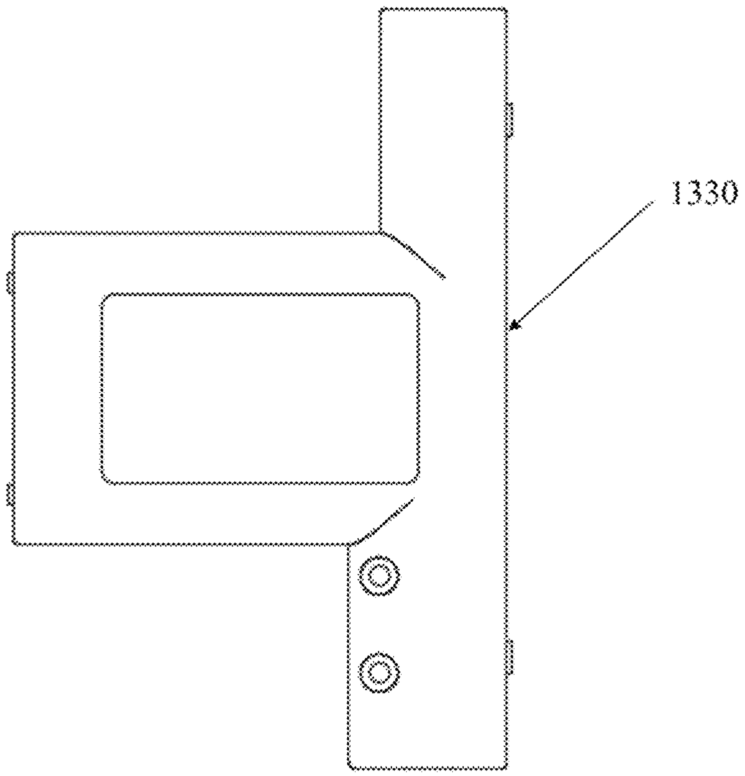
FIG. 14 is a front view of a second cover component of a current detection device according to some embodiments of the present invention.

FIG. 13 shows the current detection device 900 with the cover component 960 removed. FIG. 14 is a front view, and FIG. 15 is a rear perspective view of the second cover component 1330.

Figure 15:
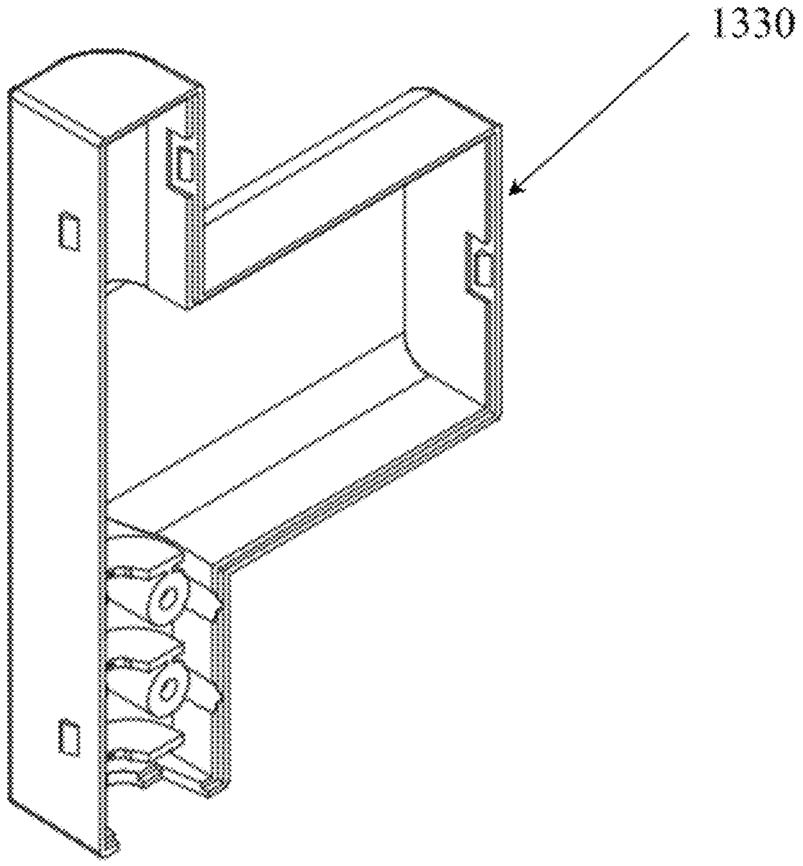
FIG. 15 is a rear perspective view of a second cover component of a current detection device according to some embodiments of the present invention.

In FIGS. 13-15, a bus bar 1310 is fixed to the threaded bolt 125 of the shunt resistor 100 using a metal grommet 1312 and nut 1311. This bus bar 1310 carries the input DC current signal. Similarly, a bus bar 1320 is fixed to the threaded bolt 135 of the shunt resistor 100 using a metal grommet 1322 and nut 1321. This bus bar 1320 carries the output DC current signal. The current detection device 900 also includes a second cover component 1330. An area 1350 on the left of the second cover component 1330 can be used to fix a label with shunt resistor information.

Figure 16:
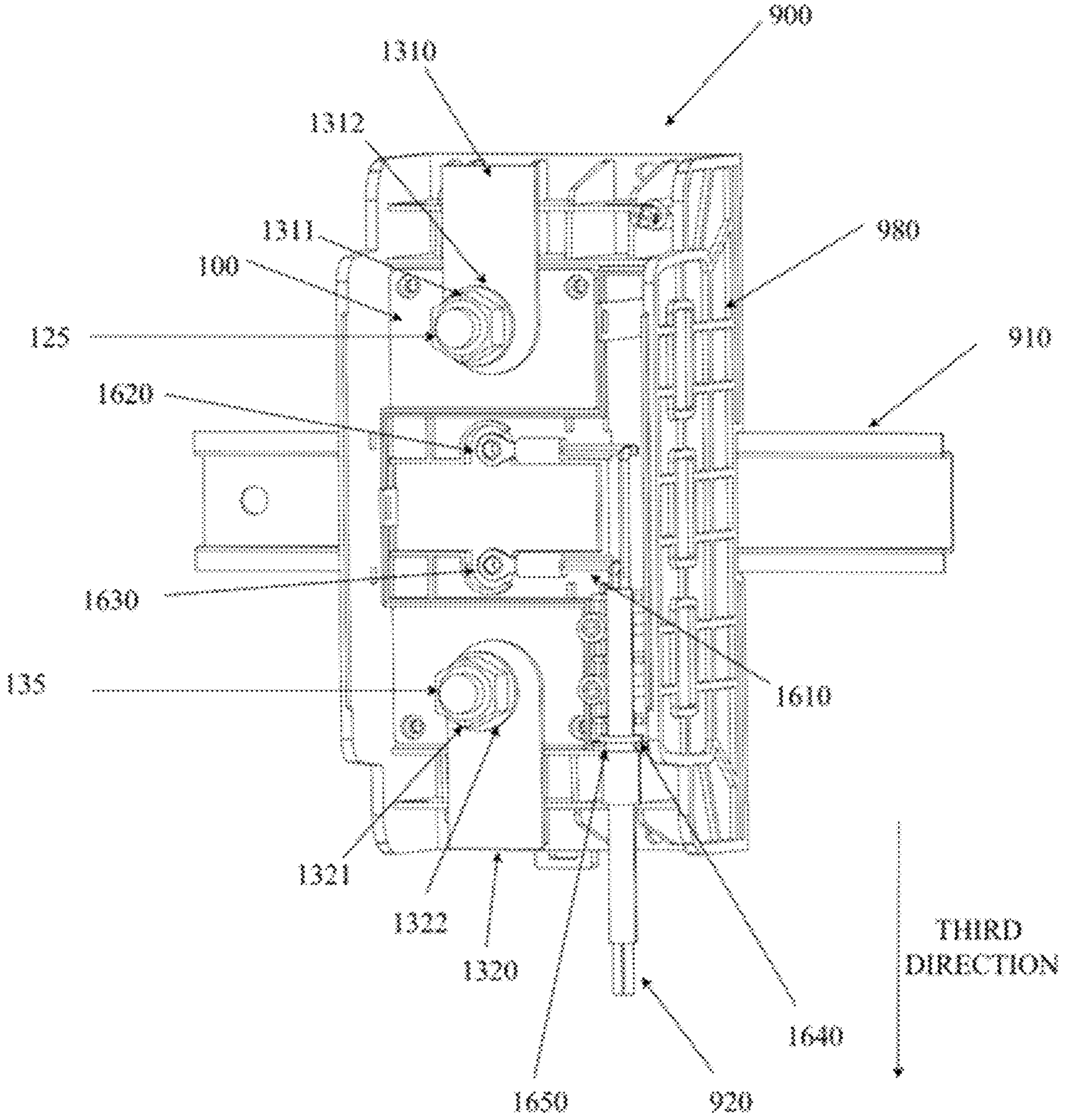
FIG. 16 is a front perspective view of a current detection device with a cover component and a second cover component removed according to some embodiments of the present invention.
Figure 17:
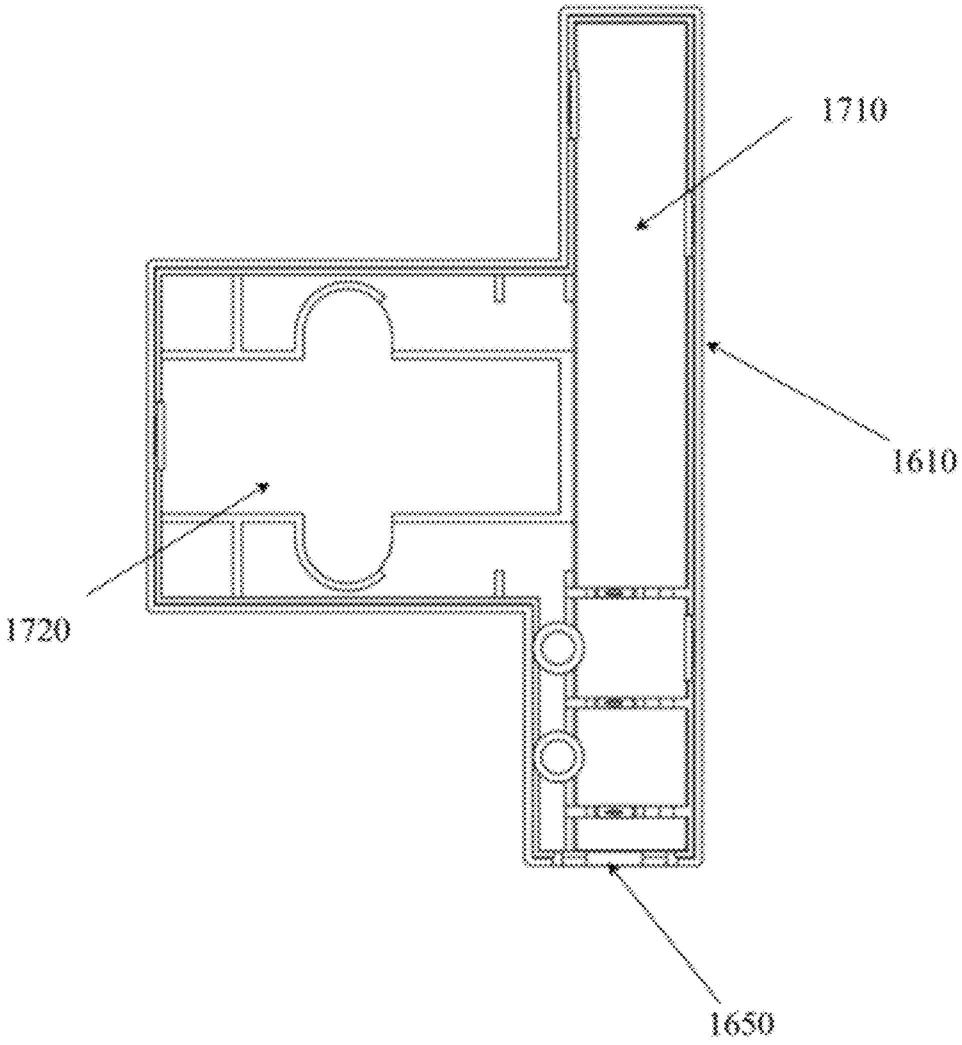
FIG. 17 is a front view of a support component of a current detection device according to some embodiments of the present invention.

FIG. 16 shows the current detection device 900 with the cover component 960 and the second cover component 1330 removed. FIG. 17 is the front view of a support component 1610 of the current detection device 900.

In FIG. 16, the current detection device 900 includes a support component 1610. A lug 1620 on one end of the cable 920 is connected to the voltage detection portion 128 of the shunt resistor 100. Another lug 1630 on the end of the cable 920 is connected to the voltage detection portion 138 of the shunt resistor 100. A circular protrusion 1640 in the middle of cable 920 interacts with a circular opening 1650 on the right bottom of the support component 1610. Because the radius of the circular protrusion 1640 is larger than the radius of the circular opening 1650, the cable 920 cannot be pulled out of the current detection device 900 in the third direction after installation. This feature protects the cable 920 during field installations. The support component 1610 comprises a left part 1720 and a right part 1710, with the right part 1710 forming a recess to accommodate the cable 920.

Figure 18:
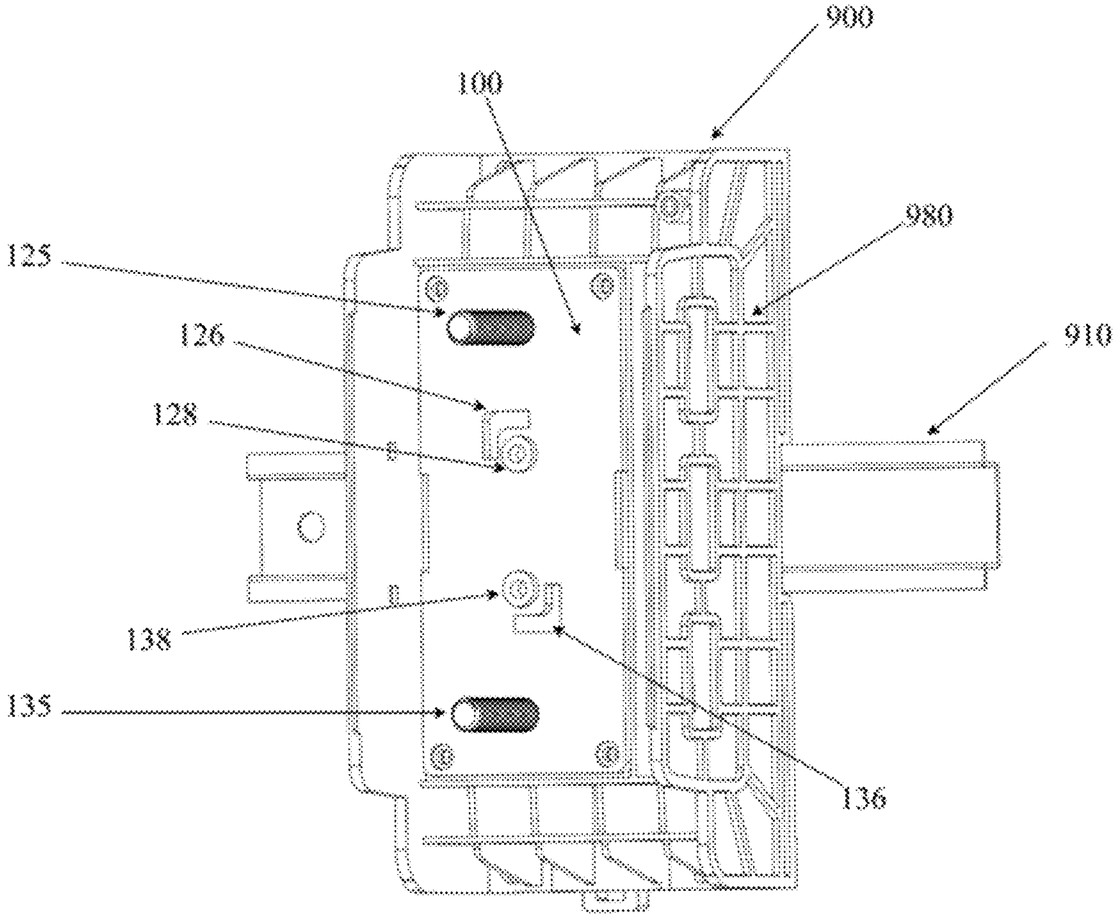
FIG. 18 is a front perspective view of a current detection device with a cover component and, a second cover component and a support component removed according to some embodiments of the present invention.

FIG. 18 shows the current detection device 900 with the cover component 960, the second cover component 1330, and the support component 1610 removed. In FIG. 18, the shunt resistor 100 is installed on the base component 980.

Figure 19:
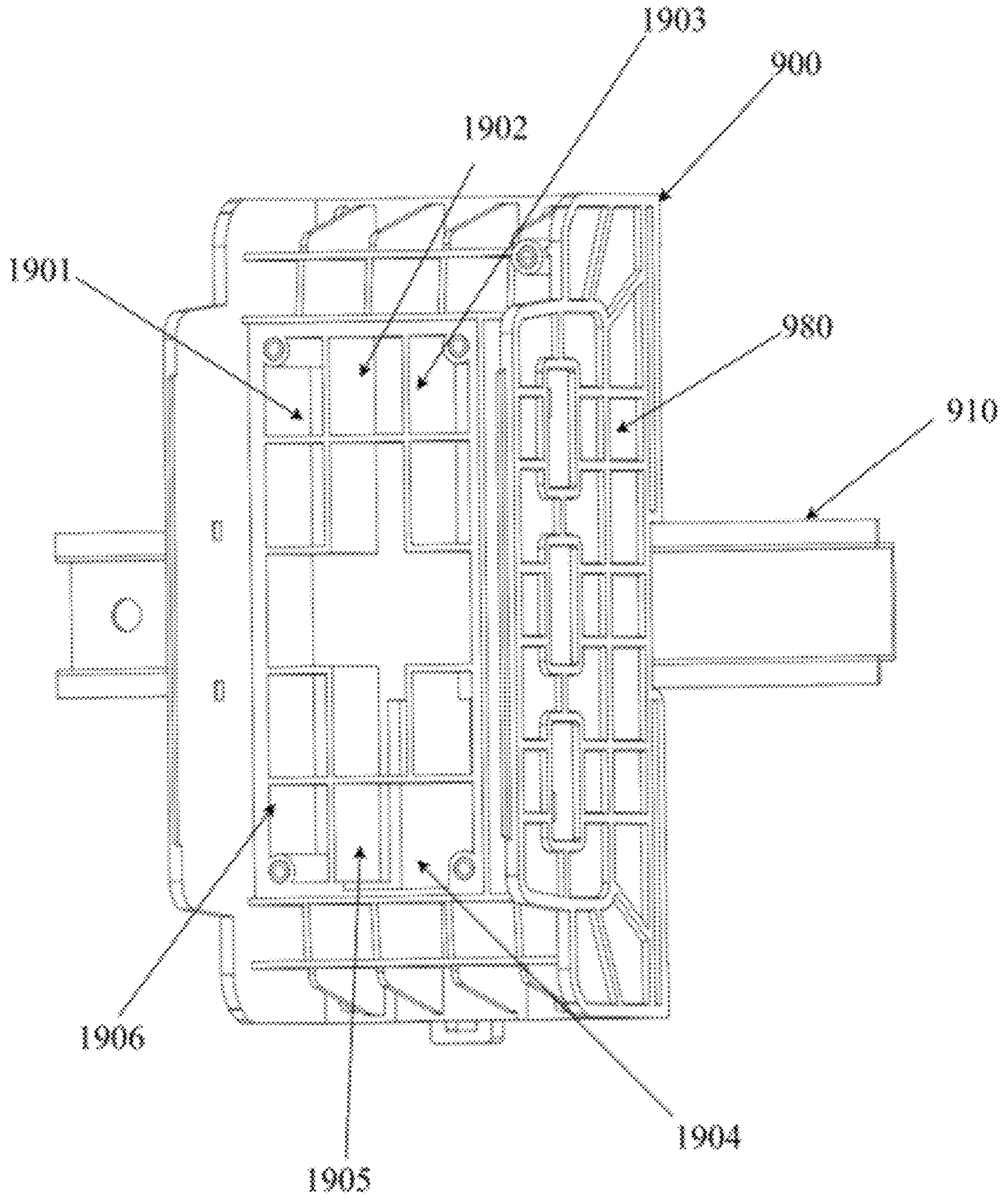
FIG. 19 is a front perspective view of a current detection device with a cover component and, a second cover component, a support component and a shunt resistor removed according to some embodiments of the present invention.

FIG. 19 shows the current detection device 900 with the cover component 960, the second cover component 1330, the support component 1610, and the shunt resistor 100 removed. FIG. 19 illustrates the base component 980 affixed to the DIN rail 910. The base component 980 includes several isolated grid spaces 1901-1906. These isolated grid spaces improve the heat dissipation efficiency of the shunt resistor 100 installed in the current detection device 900.

Embodiments of the teachings of the present disclosure have been described in an illustrative manner. It is to be understood that the terminology that has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. A current detection device comprising:

a shunt resistor comprising a resistance element: a pair of electrodes connected to opposite ends of the resistance element in a first direction: each electrode having a contact surface interfacing with the resistance element and equipped with bolt holes for attachment; wherein the shunt resistor further includes recessed portions formed on opposite side surfaces extending in a second direction perpendicular to the first direction: and-wherein each electrode incorporates an L-shaped opening, the L-shaped opening comprising a first linear portion parallel to the first direction and a second linear portion parallel to the second direction:

a base component configured to be affixed to a DIN rail;

a cover component installed onto the base component using a snap-fit mechanism;

an opening on the top of the current detection device to allow a bus bar carrying the input current signal to enter the device;

an opening on the bottom of the current detection device to allow a bus bar carrying the output current signal to exit the device;

a cable connected to voltage detection portions of the shunt resistor, with one end of the cable connected to a power meter to transfer the measured voltage to the power meter.

2. The current detection device of claim 1, further comprising an opening in the middle of the current detection device displaying a label containing shunt resistor information.

3. The current detection device of claim 1, further comprising a screw securing the cover component to the base component through a hollow cylindrical projection on the cover component.

4. The current detection device of claim 1, wherein the base component is configured to be affixed to the DIN rail via a clip.

5. The current detection device of claim 1, wherein the bus bar carrying the input current signal is fixed to a threaded bolt of the shunt resistor using a metal grommet and nut, and the bus bar carrying the output current signal is fixed to a threaded bolt of the shunt resistor using a metal grommet and nut.

6. The current detection device of claim 1, further comprising a support component to accommodate the cable.

7. The current detection device of claim 6, wherein the cable is protected by the interaction between a circular protrusion on the cable and a circular opening on the support component.

8. The current detection device of claim 1, the base component comprising isolated grid spaces to improve heat dissipation efficiency of the shunt resistor installed in the device.

* * * * *